United States Patent
Honjo et al.

(10) Patent No.: US 10,790,114 B2
(45) Date of Patent: Sep. 29, 2020

(54) SCANNING ELECTRON MICROSCOPE OBJECTIVE LENS CALIBRATION USING X-Y VOLTAGES ITERATIVELY DETERMINED FROM IMAGES OBTAINED USING SAID VOLTAGES

(71) Applicant: KLA-Tencor Corporation, Milpitas, CA (US)

(72) Inventors: Ichiro Honjo, Santa Clara, CA (US); Christopher Sears, San Jose, CA (US); Hedong Yang, Santa Clara, CA (US); Thanh Ha, Milpitas, CA (US); Jianwei Wang, San Jose, CA (US); Huina Xu, San Jose, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 140 days.

(21) Appl. No.: 15/672,797

(22) Filed: Aug. 9, 2017

(65) Prior Publication Data

US 2019/0004298 A1 Jan. 3, 2019

Related U.S. Application Data (60) Provisional application No. 62/526,804, filed on Jun. 29, 2017.

(51) Int. Cl.
*H01J 37/28* (2006.01)
*G02B 21/00* (2006.01)
(Continued)

(52) U.S. Cl.
CPC ............ *H01J 37/28* (2013.01); *G02B 21/008* (2013.01); *H01J 37/10* (2013.01); *H01J 37/222* (2013.01); *H01J 37/226* (2013.01); *H01J 37/3007* (2013.01); *G06N 3/0454* (2013.01); *G06N 3/08* (2013.01); *H01J 2237/2826* (2013.01); *H01L 2924/0105* (2013.01); *H01L 2924/01079* (2013.01)

(58) Field of Classification Search
None
See application file for complete search history.

(56) References Cited

U.S. PATENT DOCUMENTS 6,066,849 A * 5/2000 Masnaghetti ........... H01J 37/28
250/310
8,188,427 B2 5/2012 Kakuta et al.
(Continued)

OTHER PUBLICATIONS

Zhou et al. "Ensembling neural networks: Many could be better than all" Artificial Intelligence 137 (2002) 239-263 (Year: 2002).*
(Continued)

*Primary Examiner* — James Choi
(74) *Attorney, Agent, or Firm* — Hodgson Russ LLP (57) ABSTRACT

Objective lens alignment of a scanning electron microscope review tool with fewer image acquisitions can be obtained using the disclosed techniques and systems. Two different X-Y voltage pairs for the scanning electron microscope can be determined based on images. A second image based on the first X-Y voltage pair can be used to determine a second X-Y voltage pair. The X-Y voltage pairs can be applied at the Q4 lens or other optical components of the scanning electron microscope.

20 Claims, 5 Drawing Sheets

(51) Int. Cl.
*H01J 37/22* (2006.01)
*H01J 37/30* (2006.01)
*H01J 37/10* (2006.01)
G06N 3/08 (2006.01)
G06N 3/04 (2006.01)

(56) References Cited

U.S. PATENT DOCUMENTS

| | | | |
|---|---|---|---|
| 2005/0006598 A1* | 1/2005 | Pearl | H01J 37/1471 250/492.1 |
| 2007/0284542 A1* | 12/2007 | Ogashiwa | G01N 23/22 250/491.1 |
| 2009/0224170 A1 | 9/2009 | Yamazaki et al. | |

OTHER PUBLICATIONS

ISA/KR, ISR and WO for PCT/US2018/040166, dated Nov. 15, 2018.

* cited by examiner

SCANNING ELECTRON MICROSCOPE OBJECTIVE LENS CALIBRATION USING X-Y VOLTAGES ITERATIVELY DETERMINED FROM IMAGES OBTAINED USING SAID VOLTAGES

CROSS-REFERENCE TO RELATED APPLICATIONS

This application claims priority to the provisional patent application filed Jun. 29, 2017 and assigned U.S. App. No. 62/526,804, the disclosure of which is hereby incorporated by reference.

FIELD OF THE DISCLOSURE

This disclosure relates to calibration in electron beam systems.

BACKGROUND OF THE DISCLOSURE

Fabricating semiconductor devices, such as logic and memory devices, typically includes processing a semiconductor wafer using a large number of semiconductor fabrication processes to form various features and multiple levels of the semiconductor devices. For example, lithography is a semiconductor fabrication process that involves transferring a pattern from a reticle to a photoresist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer and then separated into individual semiconductor devices.

Inspection processes are used at various steps during semiconductor manufacturing to detect defects on wafers to promote higher yield in the manufacturing process and, thus, higher profits. Inspection has always been an important part of fabricating semiconductor devices such as integrated circuits. However, as the dimensions of semiconductor devices decrease, inspection becomes even more important to the successful manufacture of acceptable semiconductor devices because smaller defects can cause the devices to fail. For instance, as the dimensions of semiconductor devices decrease, detection of defects of decreasing size has become necessary since even relatively small defects may cause unwanted aberrations in the semiconductor devices.

Figure 1:
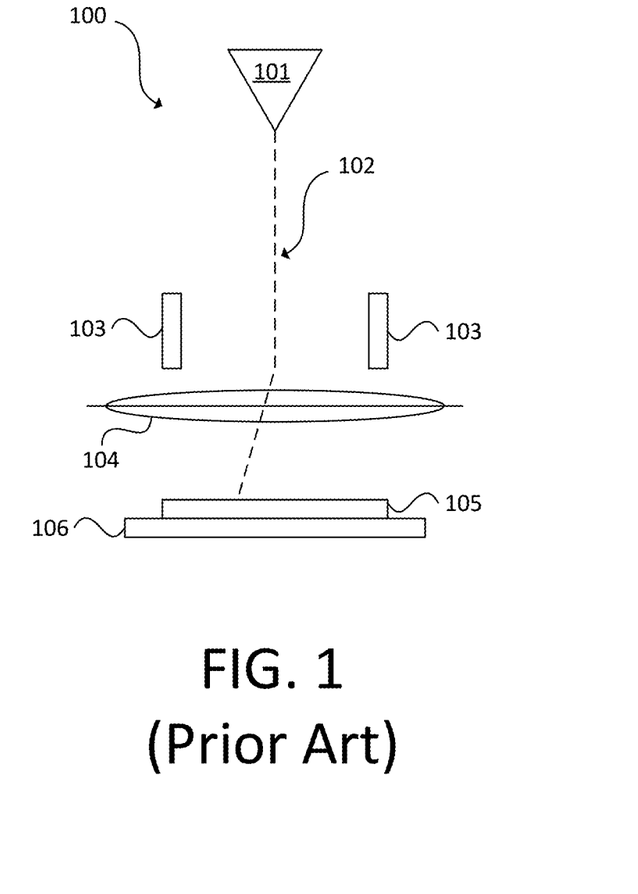
FIG. 1 is a block diagram illustrating a column in an exemplary SEM system during operation.

A scanning electron microscope (SEM) can be used during semiconductor manufacturing to detect defects. An SEM system typically consists of three imaging related subsystems: an electron source (or electron gun), electron optics (e.g., electrostatic and/or magnetic lenses), and a detector. Together, these components form a column of the SEM system. Column calibration may be performed to ensure proper working condition and good image quality in the SEM system, which includes aligning various components in the column against the electron beam. Objective lens alignment (OLA) is one such calibration task. OLA aligns the electron beam against the objective lens (OL) by adjusting the beam alignment to make sure the beam passes through the center of OL. In the SEM system 100 of FIG. 1, an electron source 101 generates an electron beam 102 (shown with a dotted line), which passes through the Q4 lens 103 and objective lens 104 toward the wafer 105 on the platen 106.

Figure 2:
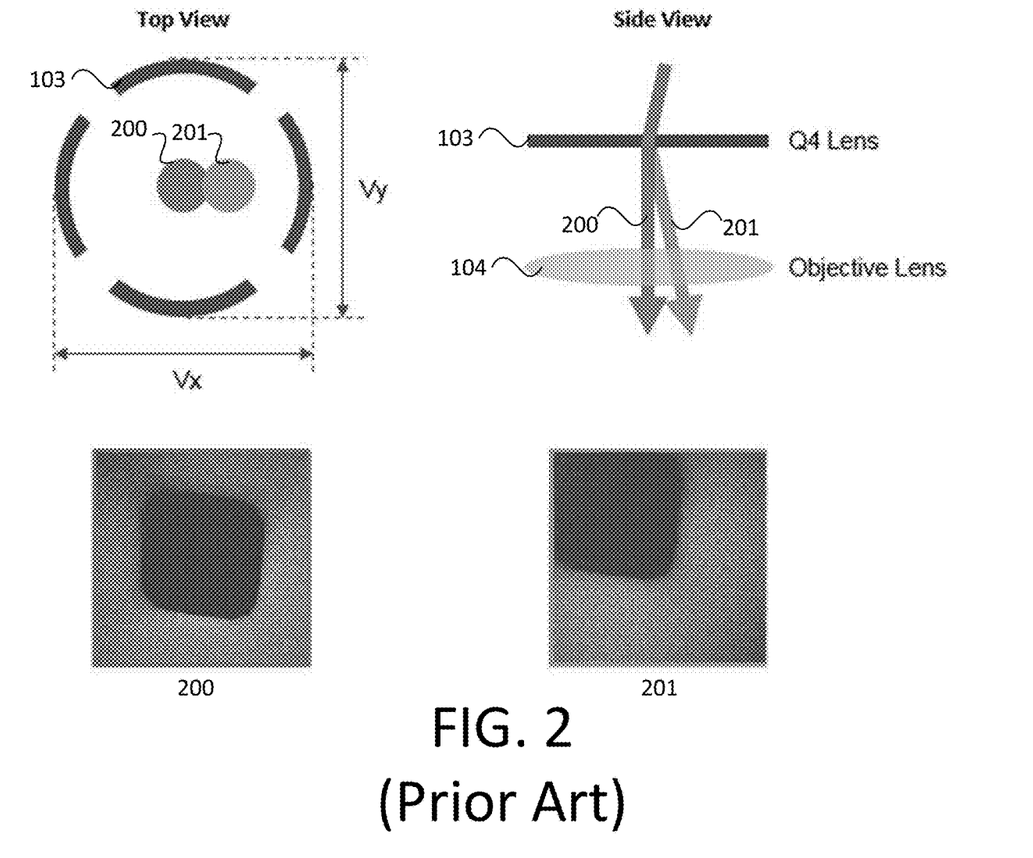
FIG. 2 is a top and corresponding side view of a block diagram including a Q4 lens with both an aligned OL and misaligned OL.

OLA typically uses a calibration chip mounted on a stage as an alignment target. An aligned OL with a target image that is centered in an image field of view (FOV) is shown in image 200 (with corresponding electron beam position) of FIG. 2. If the OL is not aligned, the beam center will be off from the lens center. As such, the target image will appear off centered in the image FOV, as seen in image 201 (with corresponding electron beam position) of FIG. 2. The amount of image offset is directly proportional to the amount of misalignment. By detecting the offsets in X and Y and converting them to the X and Y voltages (Vx, Vy) applied to beam aligner, the target image can be brought back to the center, which can provide aligned OL.

The current OLA is an iterative procedure that uses multiple progressively-smaller FOVs. First, control software sets the FOV to a certain value and adjusts beam aligner voltages while wobbling wafer bias, which causes target patterns in FOV to shift laterally if the OL is not aligned. A pattern matching algorithm detects the shift. The shift in pixels is converted to voltages using a lookup table and sent to the beam aligner to minimize the shift. Then the FOV is lowered to certain smaller value and the same steps are repeated. The FOV is then further lowered to even smaller value and the final round of adjustment is performed to make the image steady, which completes the alignment.

This technique has multiple disadvantages. The beam aligner adjustment needs to happen using at least three different FOVs and multiple images must be acquired at each FOV. This is a slow, tedious process because there are many electron beams and each electron beam must be aligned periodically. Furthermore, for higher alignment accuracy, the FOV needs to go below 3 µm. However, the smallest target on a calibration chip is about 0.5 µm. When FOV goes below 3 µm, the target image becomes too large. In addition, due to the special scanning setup for OLA, only a small area (e.g., approximately 0.2 to 0.3 µm) around the beam center is in focus, which further reduces the effective FOV. As a result, the target may fall outside the focus area and become invisible. This can make alignment fail and limit the achievable alignment accuracy.

Therefore, an improved technique and system for calibration is needed.

BRIEF SUMMARY OF THE DISCLOSURE

In a first embodiment, a method is provided. A first image is received at a control unit. The first image provides alignment information of an objective lens in a scanning electron microscope system. Using the control unit, a first X-Y voltage pair is determined based on the first image. The first X-Y voltage pair provides alignment of the objective lens closer to a center of an alignment target than in the first image. The first X-Y voltage pair is communicated to the scanning electron microscope system using the control unit. A second image is received at the control unit. The second image provides alignment information of the objective lens and the second image is a result of settings of the first X-Y voltage pair. Using the control unit, a second X-Y voltage pair is determined based on the second image. The second X-Y voltage pair provides alignment of the objective lens closer to the center of the alignment target than the first X-Y voltage pair. The second X-Y voltage pair is communicated to the scanning electron microscope system using the control unit.

The first X-Y voltage pair may be one class.

The second X-Y voltage pair may be a continuous value.

The second X-Y voltage pair can be based on an average of a plurality of results.

The method can further include applying the first X-Y voltage pair to a Q4 lens of the scanning electron microscope before generating the second image and applying the second X-Y voltage pair to the Q4 lens of the scanning electron microscope.

Determining the first X-Y voltage pair can use a first deep learning neural network. The first deep learning neural network can include a classification network.

Determining the second X-Y voltage pair can use a second deep learning neural network. The second deep learning neural network can include a regression network ensemble.

The first image and the second image can be of a carbon substrate with gold-plated tin spheres on the carbon substrate.

In a second embodiment, a non-transitory computer readable medium storing a program is provided. The program is configured to instruct a processor to: receive a first image, wherein the first image provides alignment information of an objective lens in a scanning electron microscope system; determine a first X-Y voltage pair based on the first image, wherein the first X-Y voltage pair provides alignment of the objective lens closer to a center of an alignment target than in the first image; communicate the first X-Y voltage pair; receive a second image, wherein the second image provides alignment information of the objective lens and the second image is a result of settings of the first X-Y voltage pair; determine a second X-Y voltage pair based on the second image, wherein the second X-Y voltage pair provides alignment of the objective lens closer to the center of the alignment target than the first X-Y voltage pair; and communicate the second X-Y voltage pair.

The first X-Y voltage pair may be one class.

The second X-Y voltage pair may be a continuous value.

The second X-Y voltage pair can be based on an average of a plurality of results.

Determining the first X-Y voltage pair can use a first deep learning neural network that includes a classification network.

Determining the second X-Y voltage pair can use a second deep learning neural network that includes a regression network ensemble.

The first X-Y voltage pair and the second X-Y voltage pair can be communicated to the scanning electron microscope system.

In a third embodiment, a system is provided. The system comprises a control unit. The control unit includes a processor, a memory, and a communication port in electronic communication with a scanning electron microscope system. The control unit is configured to: receive a first image, wherein the first image provides alignment information of an objective lens in the scanning electron microscope; determine a first X-Y voltage pair based on the first image, wherein the first X-Y voltage pair provides alignment of the objective lens closer to a center of an alignment target than in the first image; communicate the first X-Y voltage pair to the scanning electron microscope system; receive a second image, wherein the second image provides alignment information of the objective lens and the second image is a result of settings of the first X-Y voltage pair; determine a second X-Y voltage pair based on the second image, wherein the second X-Y voltage pair provides alignment of the objective lens closer to the center of the alignment target than the first X-Y voltage pair; and communicate the second X-Y voltage pair to the scanning electron microscope system.

The system can further include an electron beam source, an electron optical column having a Q4 lens and the objective lens, and a detector. The control unit can be in electronic communication with the Q4 lens and the detector.

The first image and the second image can be of a carbon substrate with gold-plated tin spheres on the carbon substrate.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Embodiments disclosed herein can achieve high sensitivity for OLA of an SEM system with fewer image acquisitions. The automatic calibration method is more reliable, achieves higher alignment accuracy, and reduces calibration time. Thus, a faster and more accurate estimation of beam alignment is provided.

Figure 3:
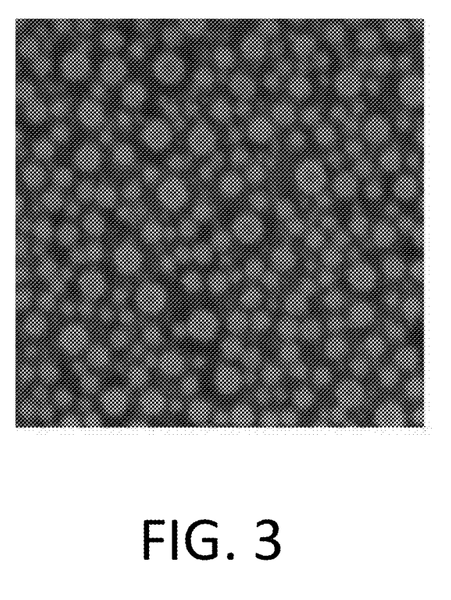
FIG. 3 is a view of a resolution standard.
Figure 4:
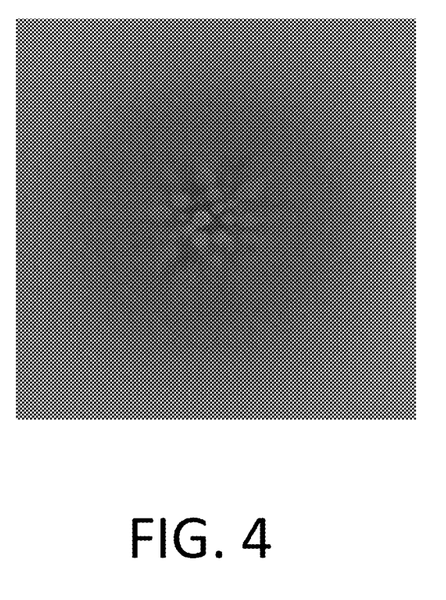
FIG. 4 is a view of a resolution standard that is centered, indicating a properly-aligned objective lens.
Figure 5:
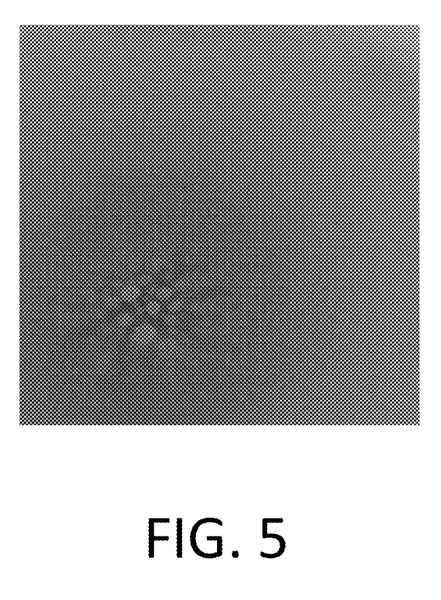
FIG. 5 is a view of a resolution standard that is not centered, indicating a misaligned objective lens.

FIG. 3 is a view of a resolution standard. A resolution standard can be used as the alignment target. The resolution standard may be a carbon substrate with gold-plated tin spheres randomly deposited on its surface. FIG. 4 is a view of a resolution standard that is centered, indicating a properly-aligned objective lens. FIG. 5 is a view of a resolution standard that is not centered, indicating a misaligned objective lens. Note the difference in location of the gold-plated tin spheres between FIG. 4 and FIG. 5. The misaligned objective lens is not centered.

While other targets can be used instead of the resolution standard with the gold-plated tin spheres, the resolution standard provides small features. For example, the diameters of the spheres can be from approximately 20 nm to 100 nm. The spheres can be distributed in an extended area (e.g., 20 $mm^2$), so there may be spheres within the focused area of any FOV. This can provide faster fine objective lens alignment (FOLA) without losing accuracy.

Figure 6:
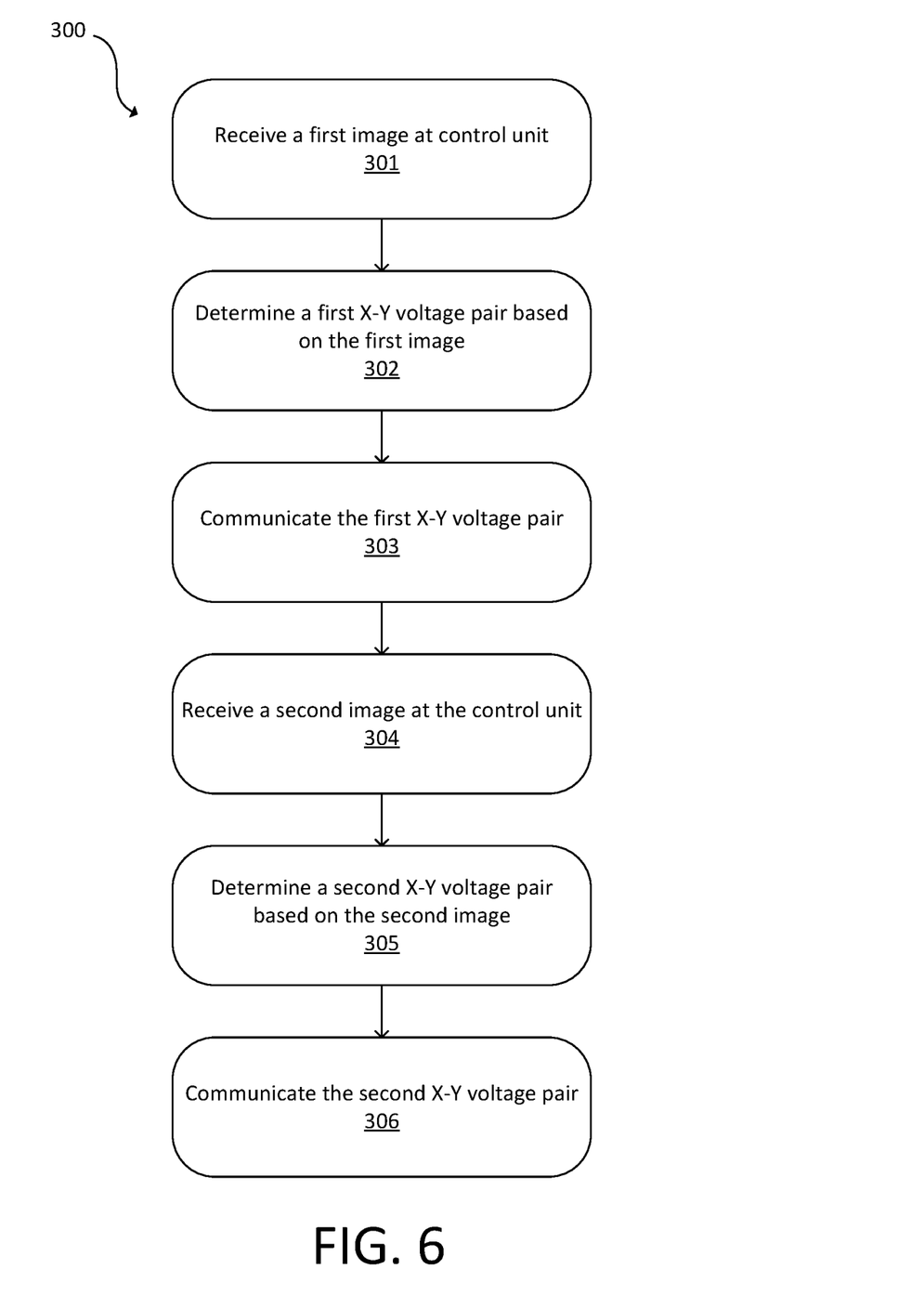
FIG. 6 is a flowchart of an alignment embodiment in accordance with the present disclosure.

FIG. 6 is a flowchart of a method 300 of alignment. In the method 300, a first image is received at a control unit at 301. The first image provides alignment information of an objective lens. For example, the first image may be the image 200 in FIG. 2 or the image in FIG. 5.

Using the control unit, a first X-Y voltage pair is determined 302 based on the first image. The first X-Y voltage pair provides better alignment of the objective lens. The alignment may be closer to a center of an alignment target than in the first image. The center location (X, Y) of the in-focus area in the first image corresponds to the X-Y voltages. In other words, $(V_x, V_y) = f(x, y)$. This relationship can be learned by a neural network during training. At runtime, the network can receive the first image and output a corresponding voltage based on (X, Y) information in the image.

Determining 302 the first X-Y voltage pair can use a classification network, which may be a deep learning neural network. The classification network can bin an input image into one of many classes, each of which corresponds to one beam aligner voltage. The classification network can try to minimize the difference between a ground truth voltage and an estimated voltage. The classification network will generate corresponding X and Y voltages based on the image, which can be used to better center the beam.

The classification network can learn all the bin voltages if all images for every possible voltage are used to train the classification network. However, to reduce the complexity of the training task, a classification network can be trained to output the coarse voltage using images acquired at a coarse voltage grid. At runtime when receiving an image, this classification network can generate a voltage pair that falls on one of the coarse grid points whose images were used for training. Since the runtime image can come from voltages between coarse grid points, but the classification network output is the closest coarse grid point, the accuracy of classification network may be half of the coarse grid spacing.

Another option to generate the coarse voltage is to use an iterative procedure that uses multiple progressively-smaller FOVs.

Using the control unit, the first X-Y voltage pair is communicated 303, such as to an SEM system that can apply the first X-Y voltage pair in the Q4 lens or other optical components.

A second image is received at the control unit at 304. The second image provides alignment information of the objective lens and the second image is a result of settings of the first X-Y voltage pair. Thus, the settings are changed to the first X-Y voltage pair and the second image is obtained.

Using the control unit, a second X-Y voltage pair is determined 305 based on the second image. The second X-Y voltage pair provides alignment of the objective lens closer to the center of the alignment target than the first X-Y voltage pair. This second X-Y voltage pair may be determined using the same approach as is used to determine the first X-Y voltage pair or a different approach.

Determining 305 the second X-Y voltage pair can use a regression network ensemble, which may be a deep learning neural network. With the ensemble of multiple regression networks, each regression network can take an input image and generate one X-Y voltage pair within certain range on each axis.

The regression network may be similar to the classification network. One difference is the last layer of the network. Whereas a regression network generates a continuous output, a classification network uses a softmax layer that generates multiple outputs representing the probability of the input belonging to a particular class. Another difference is the cost function used for training. The regression network tends to use L2 norm or some kind of distance measure between the ground truth value and the network output value as the cost function, while a classification network usually uses log likelihood as the cost function.

In an instance, the second X-Y voltage pair is based on an average of a plurality of results. For example, multiple regression networks can each provide an X-Y voltage pair and the resulting X-Y voltage pairs are averaged to produce the second X-Y voltage pair.

Using the control unit, the second X-Y voltage pair is communicated 306, such as to an SEM system that can apply the second X-Y voltage pair in the Q4 lens or other optical components.

In an instance, the first X-Y voltage pair is one class and the second X-Y voltage pair is a continuous value.

Thus, in an instance, a classification network can be used to find the first X-Y voltage pair and the regression network can be used to find the second X-Y voltage pair.

Embodiments of the present disclosure can use deep learning neural networks to align optical components in an SEM system. The deep learning based method can directly relate the image to the voltage, eliminating the need for a lookup table which could bring additional error if not generated properly. Thus, the images themselves can be used to determine voltage settings.

The first image and the second image can be of a carbon substrate with gold-plated tin spheres on the carbon substrate or some other substrate.

Steps 301-303 can be referred to as a coarse process. Steps 304-306 can be referred to as a fine process. An advantage of the coarse process is that it narrows the computation time needed to perform the fine process.

Instead of using template matching with multiple images, the method 300 can use a deep learning-based algorithm that estimates the beam aligner voltages with higher accuracy directly from a single resolution standard image. The coarse-to-fine approach also can reduce the amount of training images needed to cover an entire beam aligner X-Y voltage space at certain spacing. Without the coarse step, there may be too many beam aligner points (e.g., images) that the regression network would need to learn. With the coarse-to-fine approach, the total number of beam aligner points to learn for classification and regression networks together is reduced.

Another benefit of the classifier is that a confidence score associated with each class label output can be provided, which can be used to filter out bad sites or blurry images. The confidence scores generated by the classification network is the probability that an input image belongs to a particular voltage grid point (or class). The network outputs N confidence scores (N classes) for each input image. The class of the highest score is assigned to the input image, which assigns the corresponding voltage to the image as well. A low confidence score can mean the network is not sure which voltage grid point it should assign the input image to. This can happen if the image is acquired from an area on the resolution standard where tin spheres are missing or damaged, in which case the low confidence score can tell system to skip the area and move to another area to grab a new image.

The classification network and the regression network (or each of the regression networks) can be trained. An X-Y voltage pair is applied and a resulting image is obtained. The X voltage and Y voltages are varied in multiple X-Y voltage pairs and the process is repeated. These images are each associated with a particular X-Y voltage pair and can be used to train the algorithm.

In addition to X-Y voltage, the focus can be varied such that the images acquired for training may include images that are less sharp. This can train the network to work with images that are not in perfect focus.

Figure 7:
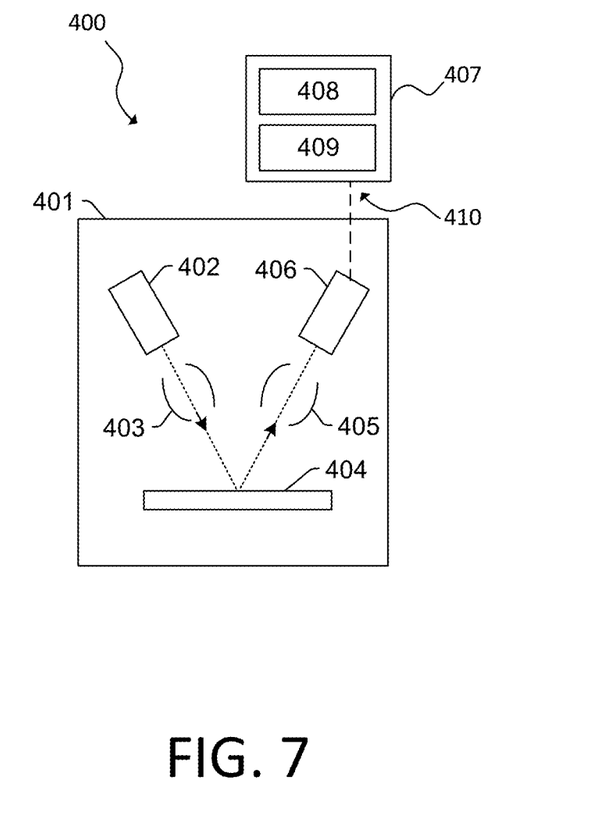
FIG. 7 is a block diagram of an embodiment of a system in accordance with the present disclosure.

The embodiments described herein may include or be performed in a system, such as the system 400 of FIG. 7. The system 400 includes an output acquisition subsystem that includes at least an energy source and a detector. The output acquisition subsystem may be an electron beam-based output acquisition subsystem. For example, in one embodiment, the energy directed to the wafer 404 includes electrons, and the energy detected from the wafer 404 includes electrons. In this manner, the energy source may be an electron beam source 402. In one such embodiment shown in FIG. 7, the output acquisition subsystem includes electron optical column 401, which is coupled to control unit 407. The control unit 407 can include one or more processors 408 and one or more memory 409. Each processor 408 may be in electronic communication with one or more of the memory 409. In an embodiment, the one or more processors 408 are communicatively coupled. In this regard, the one or more processors 408 may receive the image of the wafer 404 and store the image in the memory 409 of the control unit 407. The control unit 407 also may include a communication port 410 in electronic communication with at least one processor 408. The control unit 407 may be part of an SEM itself or may be separate from the SEM (e.g., a standalone control unit or in a centralized quality control unit).

As also shown in FIG. 7, the electron optical column 401 includes electron beam source 402 configured to generate electrons that are focused to the wafer 404 by one or more elements 403. The electron beam source 402 may include an emitter and the one or more elements 403 may include, for example, a gun lens, an anode, a beam limiting aperture, a gate valve, a beam current selection aperture, an objective lens, a Q4 lens, and/or a scanning subsystem. The electron column 401 may include any other suitable elements known in the art. While only one electron beam source 402 is illustrated, the system 400 may include multiple electron beam sources 402.

Electrons returned from the wafer 404 (e.g., secondary electrons) may be focused by one or more elements 405 to the detector 406. One or more elements 405 may include, for example, a scanning subsystem, which may be the same scanning subsystem included in element(s) 403. The electron column 401 may include any other suitable elements known in the art.

Although the electron column 401 is shown in FIG. 7 as being configured such that the electrons are directed to the wafer 404 at an oblique angle of incidence and are scattered from the wafer at another oblique angle, it is to be understood that the electron beam may be directed to and scattered from the wafer at any suitable angle. In addition, the electron beam-based output acquisition subsystem may be configured to use multiple modes to generate images of the wafer 404 (e.g., with different illumination angles, collection angles, etc.). The multiple modes of the electron beam-based output acquisition subsystem may be different in any image generation parameters of the output acquisition subsystem.

The control unit 407 may be in electronic communication with the detector 406 or other components of the system 400. The detector 406 may detect electrons returned from the surface of the wafer 404 thereby forming electron beam images of the wafer 404. The electron beam images may include any suitable electron beam images. The control unit 407 may be configured according to any of the embodiments described herein. The control unit 407 also may be configured to perform other functions or additional steps using the output of the detector 406 and/or the electron beam images. For example, the control unit 407 may be programmed to perform some or all of the steps of FIG. 6.

It is to be appreciated that the control unit 407 may be implemented in practice by any combination of hardware, software, and firmware. Also, its functions as described herein may be performed by one unit, or divided up among different components, each of which may be implemented in turn by any combination of hardware, software, and firmware. Program code or instructions for the control unit 407 to implement various methods and functions may be stored in controller readable storage media, such as a memory 409, within the control unit 407, external to the control unit 407, or combinations thereof.

It is noted that FIG. 7 is provided herein to generally illustrate a configuration of an electron beam-based output acquisition subsystem. The electron beam-based output acquisition subsystem configuration described herein may be altered to optimize the performance of the output acquisition subsystem as is normally performed when designing a commercial output acquisition system. In addition, the system described herein or components thereof may be implemented using an existing system (e.g., by adding functionality described herein to an existing system). For some such systems, the methods described herein may be provided as optional functionality of the system (e.g., in addition to other functionality of the system).

While disclosed as part of a defect review system, the control unit 407 or methods described herein may be configured for use with inspection systems. In another embodiment, the control unit 407 or methods described herein may be configured for use with a metrology system. Thus, the embodiments as disclosed herein describe some configurations for classification that can be tailored in a number of manners for systems having different imaging capabilities that are more or less suitable for different applications.

In particular, the embodiments described herein may be installed on a computer node or computer cluster that is a component of or coupled to the detector 406 or another component of a defect review tool, a mask inspector, a virtual inspector, or other devices. In this manner, the embodiments described herein may generate output that can be used for a variety of applications that include, but are not limited to, wafer inspection, mask inspection, electron beam inspection and review, metrology, or other applications. The characteristics of the system 400 shown in FIG. 7 can be modified as described above based on the specimen for which it will generate output.

The control unit 407, other system(s), or other subsystem(s) described herein may take various forms, including a personal computer system, workstation, image computer, mainframe computer system, workstation, network appliance, internet appliance, parallel processor, or other device. In general, the term "control unit" may be broadly defined to encompass any device having one or more processors that executes instructions from a memory medium. The subsystem(s) or system(s) may also include any suitable processor known in the art, such as a parallel processor. In addition, the subsystem(s) or system(s) may include a platform with high speed processing and software, either as a standalone or a networked tool.

If the system includes more than one subsystem, then the different subsystems may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

In another embodiment, the control unit 407 may be communicatively coupled to any of the various components or sub-systems of system 400 in any manner known in the art. Moreover, the control unit 407 may be configured to receive and/or acquire data or information from other systems (e.g., inspection results from an inspection system such as a broad band plasma (BBP) tool, a remote database including design data and the like) by a transmission medium that may include wired and/or wireless portions. In this manner, the transmission medium may serve as a data link between the control unit 407 and other subsystems of the system 400 or systems external to system 400.

The control unit 407 may be coupled to the components of the system 400 in any suitable manner (e.g., via one or more transmission media, which may include wired and/or wireless transmission media) such that the control unit 407 can receive the output generated by the system 400. The control unit 407 may be configured to perform a number of functions using the output. In another example, the control unit 407 may be configured to send the output to a memory 409 or another storage medium without performing defect review on the output. The control unit 407 may be further configured as described herein.

An additional embodiment relates to a non-transitory computer-readable medium storing program instructions executable on a controller for performing a computer-implemented method for aligning an SEM system, as disclosed herein. In particular, as shown in FIG. 7, the control unit 407 can include a memory 409 or other electronic data storage medium with non-transitory computer-readable medium that includes program instructions executable on the control unit 407. The computer-implemented method may include any step(s) of any method(s) described herein. The memory 409 or other electronic data storage medium may be a storage medium such as a magnetic or optical disk, a magnetic tape, or any other suitable non-transitory computer-readable medium known in the art.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes (MFC), SSE (Streaming SIMD Extension), or other technologies or methodologies, as desired.

In some embodiments, various steps, functions, and/or operations of system 400 and the methods disclosed herein are carried out by one or more of the following: electronic circuits, logic gates, multiplexers, programmable logic devices, ASICs, analog or digital controls/switches, microcontrollers, or computing systems. Program instructions implementing methods such as those described herein may be transmitted over or stored on carrier medium. The carrier medium may include a storage medium such as a read-only memory, a random access memory, a magnetic or optical disk, a non-volatile memory, a solid state memory, a magnetic tape and the like. A carrier medium may include a transmission medium such as a wire, cable, or wireless transmission link. For instance, the various steps described throughout the present disclosure may be carried out by a single control unit 407 (or computer system) or, alternatively, multiple control units 407 (or multiple computer systems). Moreover, different sub-systems of the system 400 may include one or more computing or logic systems. Therefore, the above description should not be interpreted as a limitation on the present invention but merely an illustration.

Each of the steps of the method may be performed as described herein. The methods also may include any other step(s) that can be performed by the control unit and/or computer subsystem(s) or system(s) described herein. The steps can be performed by one or more computer systems, which may be configured according to any of the embodiments described herein. In addition, the methods described above may be performed by any of the system embodiments described herein.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A method comprising:
   receiving a first image at a control unit, wherein the first image provides alignment information of an objective lens in a scanning electron microscope system;
   determining, using the control unit, a first X-Y voltage pair based on the first image, wherein the first X-Y voltage pair provides alignment of the objective lens closer to a center of an alignment target than in the first image, wherein determining the first X-Y voltage pair uses a first deep learning neural network, and wherein determining the first X-Y voltage pair using the first deep learning neural network includes classifying the first image based on a set of training images and generating the first X-Y voltage pair such that the first X-Y voltage pair falls on a coarse grid point from the training images;
   communicating, using the control unit, the first X-Y voltage pair to the scanning electron microscope system;
   receiving a second image at the control unit, wherein the second image provides alignment information of the objective lens and the second image is a result of settings of the first X-Y voltage pair;
   determining, using the control unit, a second X-Y voltage pair based on the second image, wherein the second X-Y voltage pair provides alignment of the objective lens closer to the center of the alignment target than the first X-Y voltage pair, and wherein determining the second X-Y voltage pair uses a second deep learning neural network; and
   communicating, using the control unit, the second X-Y voltage pair to the scanning electron microscope system.

2. The method of claim 1, wherein the first X-Y voltage pair is one class.

3. The method of claim 1, wherein the second X-Y voltage pair is a continuous value.

4. The method of claim 1, wherein the second X-Y voltage pair is based on an average of a plurality of results.

5. The method of claim 1, further comprising:
   applying the first X-Y voltage pair to a Q4 lens of the scanning electron microscope before generating the second image; and applying the second X-Y voltage pair to the Q4 lens of the scanning electron microscope.

6. The method of claim 1, wherein the first deep learning neural network includes a classification network.

7. The method of claim 1, wherein the second deep learning neural network includes a regression network ensemble.

8. The method of claim 1, wherein the first image and the second image are of a carbon substrate with gold-plated tin spheres on the carbon substrate.

9. The method of claim 1, wherein the first X-Y voltage pair corresponds to an X coordinate and a Y coordinate of a center of an in-focus area of the first image.

10. The method of claim 1, wherein determining the second X-Y voltage pair using the second deep learning neural network includes classifying the second image based on the set of training images and generating the second X-Y voltage pair such that the second X-Y voltage pair falls on a coarse grid point from the training images.

11. A non-transitory computer readable medium storing a program configured to instruct a processor to:
receive a first image, wherein the first image provides alignment information of an objective lens in a scanning electron microscope system;
determine a first X-Y voltage pair based on the first image, wherein the first X-Y voltage pair provides alignment of the objective lens closer to a center of an alignment target than in the first image, wherein determining the first X-Y voltage pair uses a first deep learning neural network, and wherein determining the first X-Y voltage pair using the first deep learning neural network includes classifying the first image based on a set of training images and generating the first X-Y voltage pair such that the first X-Y voltage pair falls on a coarse grid point from the training images;
communicate the first X-Y voltage pair;
receive a second image, wherein the second image provides alignment information of the objective lens and the second image is a result of settings of the first X-Y voltage pair;
determine a second X-Y voltage pair based on the second image, wherein the second X-Y voltage pair provides alignment of the objective lens closer to the center of the alignment target than the first X-Y voltage pair, and wherein determining the second X-Y voltage pair uses a second deep learning neural network; and
communicate the second X-Y voltage pair.

12. The non-transitory computer readable medium of claim 11, wherein the first X-Y voltage pair is one class.

13. The non-transitory computer readable medium of claim 11, wherein the second X-Y voltage pair is a continuous value.

14. The non-transitory computer readable medium of claim 11, wherein the second X-Y voltage pair is based on an average of a plurality of results.

15. The non-transitory computer readable medium of claim 11, wherein the first deep learning neural network includes a classification network.

16. The non-transitory computer readable medium of claim 11, wherein the second deep learning neural network includes a regression network ensemble.

17. The non-transitory computer readable medium of claim 11, wherein the first X-Y voltage pair and the second X-Y voltage pair are communicated to the scanning electron microscope system.

18. A system comprising:
a control unit including a processor, a memory, and a communication port in electronic communication with a scanning electron microscope system, wherein the control unit is configured to:
receive a first image, wherein the first image provides alignment information of an objective lens in the scanning electron microscope;
determine a first X-Y voltage pair based on the first image using a first deep learning neural network, wherein the first X-Y voltage pair provides alignment of the objective lens closer to a center of an alignment target than in the first image, and wherein determining the first X-Y voltage pair using the first deep learning neural network includes classifying the first image based on a set of training images and generating the first X-Y voltage pair such that the first X-Y voltage pair falls on a coarse grid point from the training images;
communicate the first X-Y voltage pair to the scanning electron microscope system;
receive a second image, wherein the second image provides alignment information of the objective lens and the second image is a result of settings of the first X-Y voltage pair;
determine a second X-Y voltage pair based on the second image using a second deep learning neural network, wherein the second X-Y voltage pair provides alignment of the objective lens closer to the center of the alignment target than the first X-Y voltage pair; and
communicate the second X-Y voltage pair to the scanning electron microscope system.

19. The system of claim 18, further comprising an electron beam source, an electron optical column having a Q4 lens and the objective lens, and a detector, wherein the control unit is in electronic communication with the Q4 lens and the detector.

20. The system of claim 18, wherein the first image and the second image are of a carbon substrate with gold-plate tin spheres on the carbon substrate.

* * * * *